(12) United States Patent
Hong et al.

(10) Patent No.: US 8,211,540 B2
(45) Date of Patent: Jul. 3, 2012

(54) ADHESIVE FILM COMPOSITION, ASSOCIATED DICING DIE BONDING FILM, DIE PACKAGE, AND ASSOCIATED METHODS

(75) Inventors: Yong Woo Hong, Suwon-si (KR); Ki Seong Jung, Gunpo-si (KR); Wan Jung Kim, Seoul (KR); Su Mi Im, Gunpo-si (KR); Sang Jin Kim, Gunpo-si (KR); Chang Beom Chung, Yongin-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 836 days.

(21) Appl. No.: 12/285,568

(22) Filed: Oct. 8, 2008

(65) Prior Publication Data

US 2009/0110940 A1   Apr. 30, 2009

(30) Foreign Application Priority Data

Oct. 8, 2007   (KR) .................. 10-2007-0100947

(51) Int. Cl.
- *B32B 27/38* (2006.01)
- *B32B 27/26* (2006.01)
- *C08L 13/00* (2006.01)
- *C08L 15/00* (2006.01)
- *C08L 63/00* (2006.01)
- *H01L 23/02* (2006.01)
- *H01L 21/00* (2006.01)

(52) U.S. Cl. .................. 428/354; 257/678; 428/355 EP; 428/413; 428/414; 438/118; 438/127; 523/440; 525/476; 525/477; 525/523; 525/524; 525/533

(58) Field of Classification Search .................. 428/354, 428/355 R, 355 EP, 355 AC, 413, 414; 525/523, 525/524, 533, 474, 476, 477; 257/678; 438/118, 438/127; 523/440, 451

See application file for complete search history.

(56) References Cited

U.S. PATENT DOCUMENTS

| | | | | |
|---|---|---|---|---|
| 5,476,565 A | * | 12/1995 | Akada et al. .................. | 156/235 |
| 7,863,758 B2 | * | 1/2011 | Jung et al. ..................... | 257/783 |
| 2003/0069331 A1 | * | 4/2003 | Teiichi et al. ................. | 523/176 |
| 2004/0105990 A1 | * | 6/2004 | Shiobara et al. ............. | 428/473.5 |
| 2006/0252234 A1 | * | 11/2006 | Saiki ............................. | 438/464 |
| 2008/0063871 A1 | * | 3/2008 | Jung et al. ..................... | 428/414 |
| 2008/0102284 A1 | * | 5/2008 | Hong et al. ................... | 428/413 |
| 2008/0145668 A1 | * | 6/2008 | Jung et al. ..................... | 428/413 |

FOREIGN PATENT DOCUMENTS

| | | | |
|---|---|---|---|
| JP | 08231685 A | * | 9/1996 |
| JP | 2003286391 A | * | 10/2003 |

OTHER PUBLICATIONS

Machine translation of JP 08231685 A, provided by the JPO website (no date).*

Machine translation of JP 2003286391 A, provided by the JPO website (no date).*

* cited by examiner

*Primary Examiner* — Michael J Feely

(74) *Attorney, Agent, or Firm* — Lee & Morse, P.C.

(57) ABSTRACT

An adhesive film composition includes an elastomer resin having one or more of a hydroxy group, a carboxyl group, or an epoxy group, a film-forming resin, a silylated phenolic curing resin, an epoxy resin, a curing accelerator, and a filler.

23 Claims, 7 Drawing Sheets

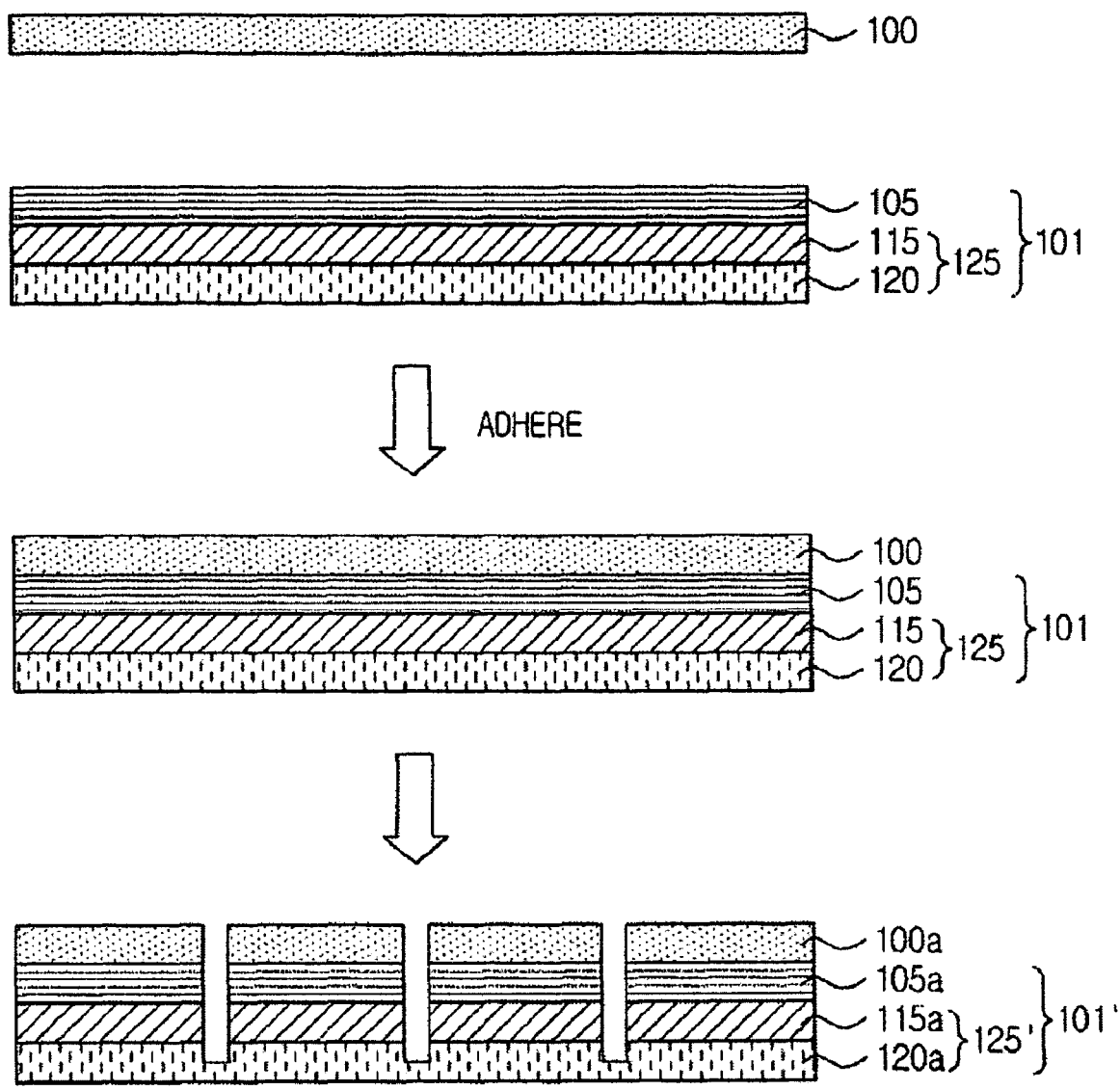

FIG. 2

Table 1

| | Solid content[9] (%) | Example 1 | Example 2 | Example 3 | Example 4 | Example 5 | Example 6 |
|---|---|---|---|---|---|---|---|
| Elastomer resin[1] | 20 | 200 | 175 | 97.5 | 200 | 200 | 110 |
| Film-forming resin[2] | 20 | 100 | 72.5 | 45 | 200 | 100 | 75 |
| Phenolic curing resin pre-reacted with silane coupling agent | 50 | 23 | 30 | 44 | 8.6 | 19 | 21 |
| Epoxy resin[3] | 50 | 36 | 50 | 78 | 10.4 | 36 | 34 |
| Curing accelerator[5] | 100 | 0.5 | 0.5 | 0.5 | 0.5 | 0.5 | 0.5 |
| Filler[6] | 100 | 10 | 10 | 10 | 10 | 10 | - |
| Filler[7] | 100 | - | - | - | - | - | 35 |
| Additional phenolic curing resin[4] | 50 | - | - | - | - | 4 | - |
| Additional silane coupling agent | n/a | - | - | - | - | - | - |
| Total (weight parts) | | 369.5 | 338.0 | 275.0 | 429.5 | 369.5 | 275.5 |

Notes: [1]: Hydroxyl value = 13 mgKOH/g, acid value = 63 mgKOH/g, $T_g$ = 38°C, weight average molecular weight = 690,000, KLS-1045, Fujikura Kasei Co., Ltd. (Japan)
[2]: Average molecular weight = 60,000, E4275, JER
[3]: Equivalent weight = 205, YDCN-500-4P, Kukdo Chemical Co., Ltd. (Korea)
[4]: Equivalent weight = 106, HF-1M, Meiwa Plastic Industries, Ltd. (Japan)
[5]: TPP, HOKKO
[6]: Aerosil-200, Degussa
[7]: SO-25R, Admatech
[8]: 3-Glycidoxypropyltrimethoxysilane, KBM-403, Shin-Etsu Chemical Co., Ltd. (Japan)
[9]: Measured in cyclohexanone as organic solvent

FIG. 3

Table 2

| | Solid content[9] (%) | Comp. Example 1 | Comp. Example 2 | Comp. Example 3 |
|---|---|---|---|---|
| Elastomer resin[1] | 20 | 200.0 | 200 | 100 |
| Film-forming resin[2] | 20 | 95.0 | 95 | 50 |
| Phenolic curing resin pre-reacted with silane coupling agent | 50 | - | - | - |
| Epoxy resin[3] | 50 | 100 | 100 | 192.5 |
| Curing accelerator[5] | 100 | 0.5 | 0.5 | 0.5 |
| Filler[6] | 100 | 10 | 10 | 10 |
| Filler[7] | 100 | - | - | - |
| Additional phenolic curing resin[4] | 50 | 47.5 | 51.5 | 100 |
| Additional silane coupling agent[8] | 100 | 1.0 | 0.2 | 1.0 |
| Total (weight parts) | | 454 | 457.2 | 454 |

Notes: [1]: Hydroxyl value = 13 mgKOH/g, acid value = 63 mgKOH/g, $T_g$ = 38°C, weight average molecular weight = 690,000, KLS-1045, Fujikura Kasei Co., Ltd. (Japan)
[2]: Average molecular weight = 60,000, E4275, JER
[3]: Equivalent weight = 205, YDCN-500-4P, Kukdo Chemical Co., Ltd. (Korea)
[4]: Equivalent weight = 106, HF-1M, Meiwa Plastic Industries, Ltd. (Japan)
[5]: TPP, HOKKO
[6]: Aerosil-200, Degussa
[7]: SO-25R, Admatech
[8]: 3-Glycidoxypropyltrimethoxysilane, KBM-403, Shin-Etsu Chemical Co., Ltd. (Japan)
[9]: Measured in cyclohexanone as organic solvent

FIG. 4

Table 3

| Property | | Example 1 | Example 2 | Example 3 | Example 4 | Example 5 | Example 6 |
|---|---|---|---|---|---|---|---|
| Volatile gas content (%) | | 1.2 | 0.9 | 0.8 | 1.6 | 1.9 | 1.3 |
| Bubble test | | Good | Good | Good | Good | Good | Good |
| Number of bubbles (≥10% in area) | | 0/30 | 0/30 | 0/30 | 0/30 | 0/30 | 0/30 |
| Reflow resistance test | | Good | Good | Good | Good | Good | Good |
| Delamination | | 0% | 0% | 0% | 0% | 0% | 0% |
| Cracks | | 0/90 | 0/90 | 0/90 | 0/90 | 0/90 | 0/90 |
| Die shear strength (kgf/chip) | | 16.9 | 15.4 | 17.8 | 15.1 | 15.7 | 16.5 |

FIG. 5

Table 4

| Property | Comparative Example 1 | Comparative Example 2 | Comparative Example 3 |
|---|---|---|---|
| Volatile gas content (%) | 5.1 | 2.9 | 4.9 |
| Bubble test | Poor | Poor | Poor |
| Number of bubbles (≥10% in area) | 23/30 | 13/30 | 16/30 |
| Reflow resistance test | Good | Poor | Poor |
| Delamination | 0% | 30% | 10% |
| Cracks | 0/90 | 8/90 | 3/90 |
| Die shear strength (kgf/chip) | 13.2 | 10.3 | 12.7 |

FIG. 6
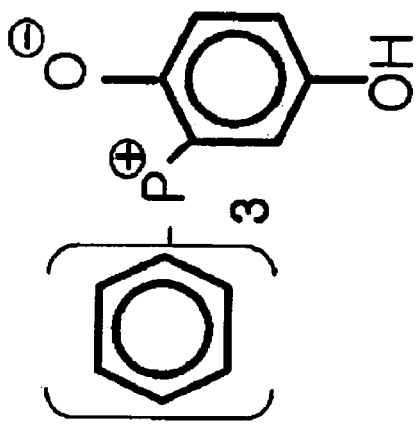
Formula 3:
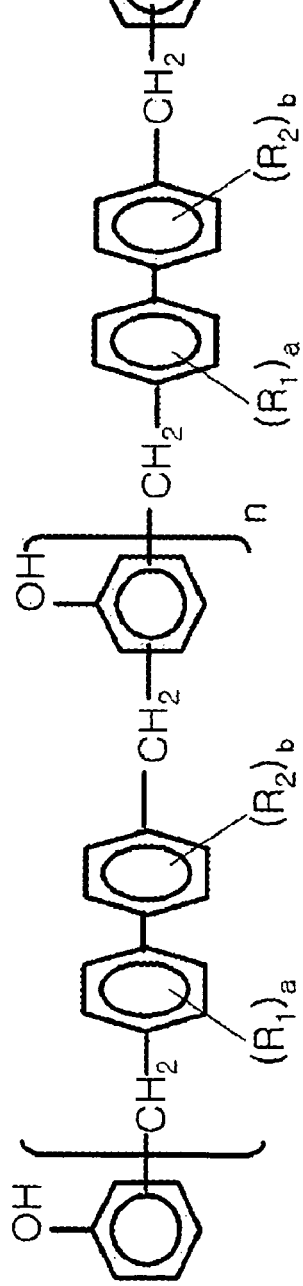
Formula 1:
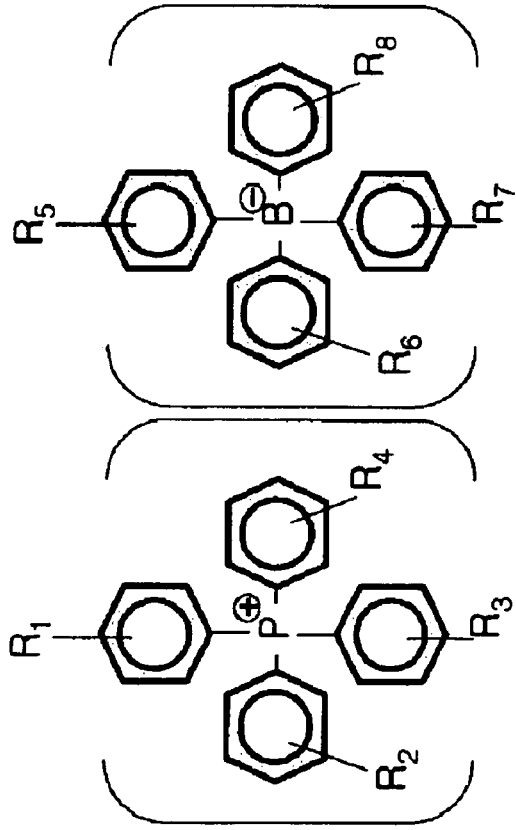
Formula 2:

ADHESIVE FILM COMPOSITION, ASSOCIATED DICING DIE BONDING FILM, DIE PACKAGE, AND ASSOCIATED METHODS

BACKGROUND OF THE INVENTION

1. Field of the Invention

Embodiments relate to an adhesive film composition and, more particularly, to an adhesive film composition that may be employed to form an adhesive film for die assembly and packaging.

2. Description of the Related Art

There has been increasing interest in using adhesive films for die assembly and packaging, e.g., in semiconductor assembly and packaging. For example, an adhesive film may be employed as part of a dicing film, which may be used to fix a semiconductor wafer during a dicing operation in a semiconductor chip manufacturing process. A typical process of using an adhesive film for semiconductor assembly may include laminating the dicing film to a semiconductor wafer and then cutting the semiconductor wafer in a dicing process. A dicing process is a process of cutting a semiconductor wafer into individual semiconductor dies, i.e., chips. Following the dicing process, an expanding process, a pick-up process and die attaching process may be sequentially performed.

The application of adhesive films to semiconductor manufacturing may be extended by employing the adhesive film as part of a dicing die bonding film, which is an integrated film used for both dicing and die bonding, i.e., die attach. In such a process, however, a pick-up process may require that a die laminated with the adhesive layer be completely picked up, e.g., removed from a pressure sensitive adhesive ("PSA") layer. Thus, the level of adhesion between the adhesive layer and the die may need to be high, in order to separate the die from the PSA layer. Further, the application of the adhesive film to a dicing die bonding film may demand greater reliability, e.g., increased tensile strength, of the adhesive film. Additionally, the quality of the interface between the adhesive film and the wafer and/or dies may be important. For example, if voids are formed at the interface of the adhesive film and the wafer and/or dies, the reliability of the resulting packaged dies may be reduced. Similarly, voids formed at the interface of the adhesive film and an underlying substrate, e.g., a printed circuit board ("PCB"), or another die or wafer, may impair reliability.

SUMMARY OF THE INVENTION

Embodiments are therefore directed to an adhesive film composition, an associated dicing die bonding film, a die package, and associated methods, which substantially overcome one or more of the problems due to the limitations and disadvantages of the related art.

It is therefore a feature of an embodiment to provide an adhesive film composition for semiconductor assembly, and an adhesive film produced using the composition, including a phenolic curing resin pre-reacted with a silane coupling agent to remove volatile components such as alcohols, moisture, and volatile reaction by-products.

At least one of the above and other features and advantages may be realized by providing an adhesive film composition, including an elastomer resin having one or more of a hydroxy group, a carboxyl group, or an epoxy group, a film-forming resin, a silylated phenolic curing resin, an epoxy resin, a curing accelerator, and a filler.

The silylated phenolic curing resin may include a phenolic curing resin moiety and a silane coupling agent moiety, and the silane coupling agent moiety may include one or more of an epoxy group, an amine group, or a mercapto group.

The silylated phenolic curing resin may include a reaction product of a phenolic curing resin and a silane coupling agent, and the silane coupling agent may include one or more of 2-(3,4-epoxycyclohexyl)-ethyltrimethoxysilane, 3-glycidoxytrimethoxysilane, 3-glycidoxypropyltrimethoxysilane, 3-glycidoxypropyltriethoxysilane, N-2-(aminoethyl)-3-aminopropylmethyldimethoxysilane, N-2-aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-1,3-dimethylbutylidene)propylamine, N-phenyl-3-aminopropyltrimethoxysilane, 3-mercaptopropylmethyldimethoxysilane, or 3-mercaptopropyltriethoxysilane.

The composition may include about 5% to about 60% by weight of the elastomer resin, about 5% to about 60% by weight of the film-forming resin, about 3% to about 25% by weight of the silylated phenolic curing resin, about 5% to about 40% by weight of the epoxy resin, about 0.01% to about 10% by weight of the curing accelerator, and about 3% to about 60% by weight of the filler, based on the total weight of solid content of the composition.

The composition may further include a second phenolic curing resin. A combined amount of the second phenolic curing resin and the silylated phenolic curing resin may be about 3% to about 30% by weight, based on the total weight of the composition.

The silylated phenolic curing resin may be a phenolic curing resin represented by Formula 1 in which at least some phenolic hydroxy groups are silylated.

Formula 1:

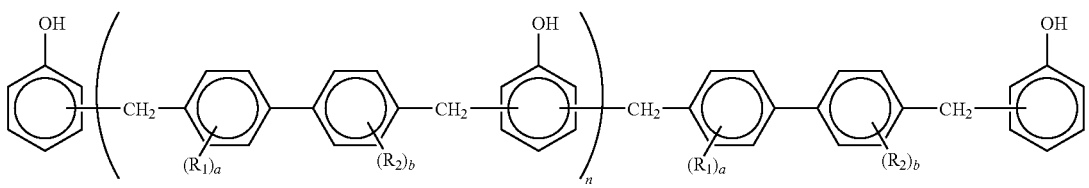

In Formula 1, $R_1$ and $R_2$ may each independently be a $C_1$-$C_4$ alkyl group or a hydrogen atom, a and b may each independently be from 0 to 4, and n may be an integer from 0 to 7.

The curing accelerator may be represented by Formula 2 or Formula 3:

Formula 2:

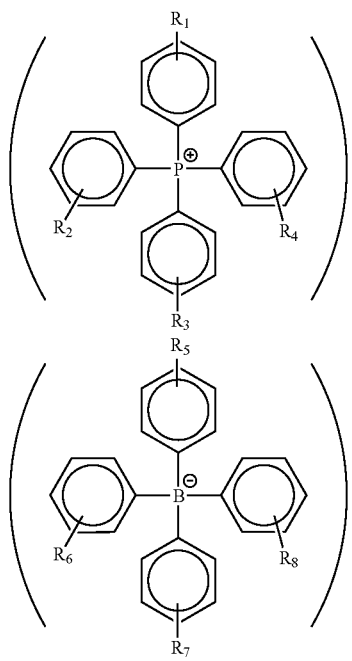

Formula 3:

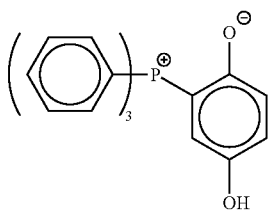

In Formula 2, $R_1$ through $R_8$ may each independently be a hydrogen atom, a halogen atom, or an alkyl group.

The epoxy resin may include one or more of a bisphenol type epoxy resin, a phenol novolac type epoxy resin, an ortho-cresol novolac type epoxy resin, a multifunctional epoxy resin, an amine type epoxy resin, a heterocyclic epoxy resin, a substituted epoxy resin, or a naphthol type epoxy resin. The epoxy resin and the silylated phenolic curing resin combined may have a ratio of epoxy equivalent weight:hydroxyl equivalent weight that is about 0.6:1 to about 1.4:1.

The film-forming resin may have a glass transition temperature of about −30° C. to about 200° C. The filler may be an inorganic filler, the filler may be spherical or amorphous in shape, and the filler may have an average particle diameter of about 5 nm to about 10 μm. The composition may further include a second silane coupling agent.

At least one of the above and other features and advantages may also be realized by providing an adhesive film for semiconductor assembly, the film including an elastomer resin having one or more of a hydroxy group, a carboxyl group, or an epoxy group, a film-forming resin, a silylated phenolic curing resin, an epoxy resin, a curing accelerator, and a filler.

At least one of the above and other features and advantages may also be realized by providing a dicing die bonding film, including a base layer, a UV-curable adhesive layer, and an adhesive film. The adhesive film may include an elastomer resin having one or more of a hydroxy group, a carboxyl group, or an epoxy group, a film-forming resin, a silylated phenolic curing resin, an epoxy resin, a curing accelerator, and a filler.

The UV-curable adhesive layer may include a polymeric binder, a UV-curable acrylate, and a photoinitiator, the UV-curable acrylate may be present in an amount of about 20 to about 150 parts by weight with respect to 100 parts by weight of the polymeric binder, and the photoinitiator may be present in an amount of about 0.1 to about 5 parts by weight with respect to 100 parts by weight of the UV-curable acrylate.

At least one of the above and other features and advantages may also be realized by providing a method of making an adhesive film, the method including preparing a composition including an elastomer resin, a film-forming resin, a silylated phenolic curing resin, an epoxy resin, a curing accelerator, and a filler, and forming a film using the composition. The elastomer resin may have one or more of a hydroxy group, a carboxyl group, or an epoxy group.

The silylated phenolic curing resin may be a phenolic curing resin treated with a silane coupling agent in a silane coupling agent:phenolic curing resin molar ratio of about 1:5 to about 1:100.

At least one of the above and other features and advantages may also be realized by providing a method of manufacturing a device package, the method including adhering a die to a next-level substrate using an adhesive member, and encapsulating the die on the next-level substrate. The adhesive member may include an elastomer resin having one or more of a hydroxy group, a carboxyl group, or an epoxy group, a film-forming resin, a silylated phenolic curing resin, an epoxy resin, a curing accelerator, and a filler.

At least one of the above and other features and advantages may also be realized by providing a device package, including a die, a next-level substrate, and an adhesive member disposed between the die and the next-level substrate. The adhesive member may include an elastomer resin having one or more of a hydroxy group, a carboxyl group, or an epoxy group, a film-forming resin, a silylated phenolic curing resin, an epoxy resin, a curing accelerator, and a filler.

BRIEF DESCRIPTION OF THE DRAWINGS

The above and other features and advantages will become more apparent to those of ordinary skill in the art by describing in detail exemplary embodiments with reference to the attached drawings, in which:

FIGS. 1A and 1B illustrate stages in a method of packaging a semiconductor device according to an embodiment;

FIGS. 2 and 3 illustrate Tables 1 and 2, respectively, which show components used in preparing Examples 1-6 and Comparative Examples 1-3;

FIGS. 4 and 5 illustrate Tables 3 and 4, respectively, which show properties of films prepared according to Examples 1-6 and Comparative Examples 1-3; and FIG. 6 illustrates chemical Formulae 1-3.

DETAILED DESCRIPTION OF THE INVENTION

Figure 1B:
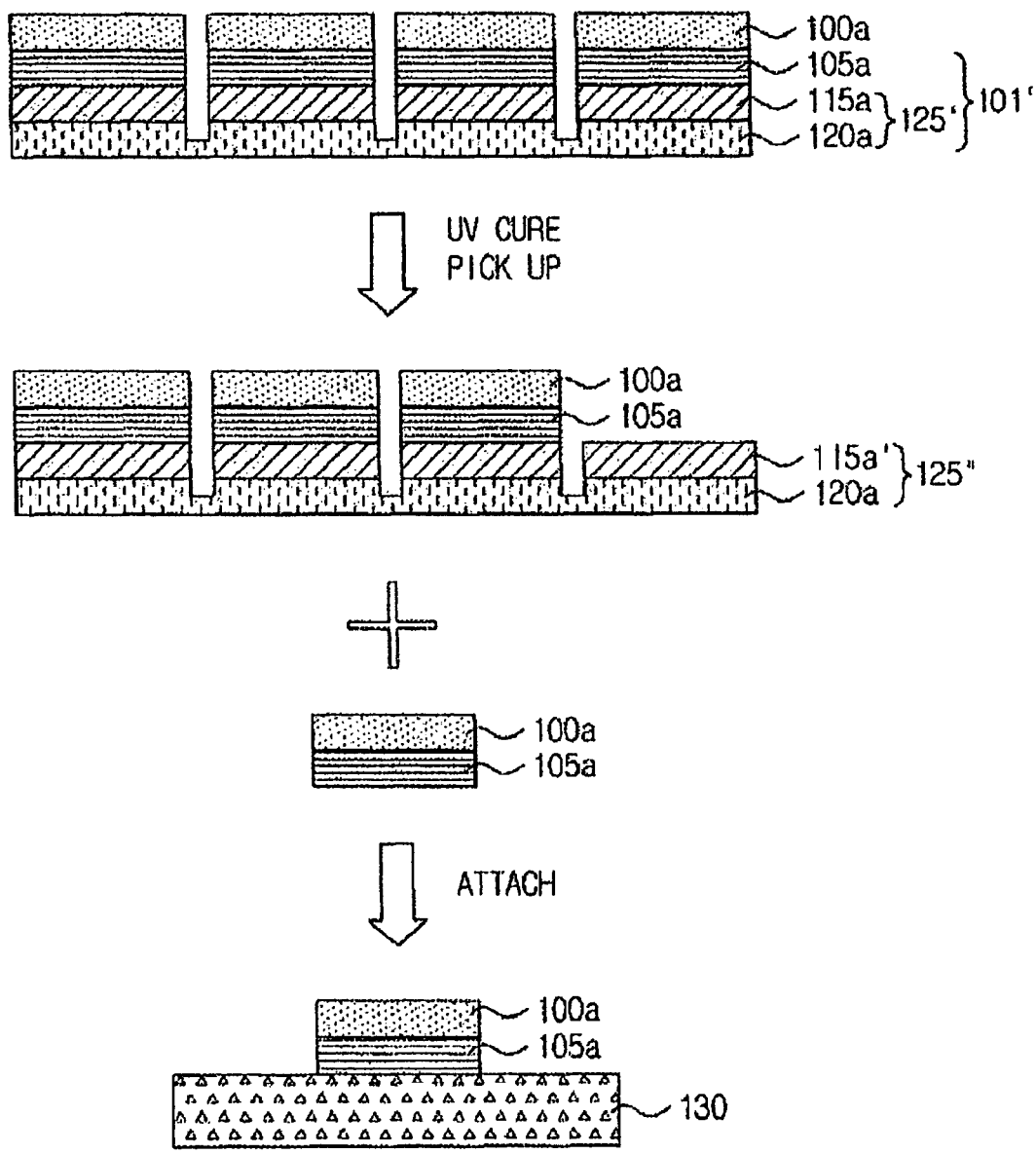

Korean Patent Application No. 10-2007-0100947, filed on Oct. 8, 2007, in the Korean Intellectual Property Office, and entitled: "Adhesive Film Composition for Semiconductor Assembly Comprising Phenolic Curing Resin Pre-Reacted with Silane Coupling Agent and Adhesive Film Therefrom," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a curing accelerator" may represent a single compound, e.g., triphenylphosphine, or multiple compounds in combination, e.g., triphenylphosphine mixed with 2-methylimidazole.

As used herein, molecular weights of polymeric materials are weight average molecular weights, unless otherwise indicated.

As used herein, the language "parts by weight, based on the total amount of the adhesive film composition," "parts by weight, based on the total amount of the composition," "percent by weight, based on the total amount of the adhesive film composition," and "percent by weight, based on the total amount of the composition" is exclusive of solvent, unless otherwise indicated. Thus, as used herein, the point of reference "the total amount of the adhesive film composition" does not include solvent. For example, where a composition is composed of two components A and B, with A present in 35 parts by weight and B present in 65 parts by weight, based on the total amount of the adhesive film composition, the addition of 10 parts by weight of solvent to the composition would result in the composition continuing to have 35 parts by weight A and 65 parts by weight B, based on the total amount of the adhesive film composition.

As used herein, the term "weight parts" refers to a unit of weight measurement, e.g., grams (g), kilograms (kg), ounces (oz), pounds (lb), etc. For example, where a composition is composed of 60 weight parts of component A and 70 weight parts of component B, the composition may have a total weight of 130 g, 130 kg, 130 oz, 1301*b*, etc.

It will be understood that, although the terms first, second, third, and the like may be used herein to describe various elements, components, regions, layers, and/or sections, these elements, components, regions, layers, and/or sections should not be limited by these terms. Rather, these terms are only used to distinguish one element, component, region, layer, and/or section from another element, component, region, layer, and/or section. Thus, a first element, component, region, layer, and/or section could be termed a second element, component, region, layer, and/or section without departing from the teachings of the present invention.

FIGS. 1A and 1B illustrate stages in an example method of packaging a semiconductor device according to an embodiment, wherein a semiconductor wafer is diced and an individual semiconductor device, i.e., die, is attached to a substrate using a dicing die bonding film.

Referring to FIGS. 1A and 1B, a semiconductor wafer 100 may have a plurality of devices fabricated thereon, e.g., memory devices, microprocessors, etc. In order to package the devices, it may be desirable to separate the semiconductor wafer 100 along scribe lines so as to form a plurality of dies 100*a*. This dicing process may involve laminating the entire, un-diced wafer 100 with a dicing die bonding film 101 that includes a dicing film 125 and an intermediate adhesive layer 105. The adhesive layer 105 of the dicing die bonding film 101 may be formed using an adhesive film composition according to an embodiment.

The dicing film 125 may include a PSA layer 115 and a base film 120. The PSA layer 115 may be, e.g., a non-curing film or a UV-curing film. The base film 120 may be, e.g., a vinylchloride film such as PVC or a polyolefin. In an implementation, the dicing film 125 may be fabricated by laminating the PSA layer 115 with the base film 120.

The dicing die bonding film 101 may be attached to the semiconductor wafer 100 at the adhesive film 105, and the PSA layer 115 may face and be attached to the adhesive layer 105.

As described above, a wafer assembly may be formed having the un-diced wafer 100 bonded to the dicing die bonding film 101 that includes the adhesive layer 105 according to an embodiment.

A dicing process may then be performed to separate the wafer 100 into a plurality of dies 100*a*. The dicing process may also separate the adhesive layer 105 into parts 100*a* corresponding to the individual dies 100*a*, as indicated by the separated adhesive layer 105*a* of the post-dicing dicing die bonding film 101'. Similarly, the dicing film 125 may be partially separated to form dicing film 125' having the PSA layer 115 separated into parts 115*a* and the base film 120 partially separated into parts 120*a*. Throughout the dicing process, the wafer 100/dies 100*a* may remain adhered to the dicing die bonding film 101/101'.

Referring to FIG. 1B, an individual die 100*a* may be removed from the dicing die bonding film 101'. This process may be enabled by exposing the assembly to ultraviolet (UV) light, which may cure the PSA layer 115*a* to yield an exposed dicing film 125" that includes the base film 120 partially separated into parts 120*a*, and includes a cured PSA layer 115*a*' having a reduced level of adhesion. In particular, the cured PSA layer 115*a*' may have a significantly lower adhesion to the diced adhesive layer 105*a*, such that, during pick up of the individual die 100*a*, the diced adhesive layer 105*a* remains adhered to the individual die 100*a* and releases from the cured PSA layer 115*a*'. Thus, the pick up process may remove the individual die 100a and its associated diced adhesive layer 105a, which may then be mounted to a substrate 130, with the diced adhesive layer 105a facing and in contact with the substrate 130, such that the individual die 100a is attached to the substrate 130. Further processes, e.g., wiring, encapsulation, etc., may also be performed.

The adhesive layer 105 may be formed using an adhesive film composition according to an embodiment, details of which will now be described.

The adhesive film composition may include a phenolic curing resin that has been pre-reacted with a silane coupling agent prior to incorporation into the composition. The phenolic curing resin may be pre-reacted with the silane coupling agent to remove volatile components, such as alcohols, moisture, etc., prior to incorporation into the composition. As a result, the formation of voids and bubbles in an adhesive film made with the composition may be minimized, which may provide an adhesive film exhibiting high reliability. Further, the formation of voids and bubbles due to volatile components may be minimized in die attach, wire bonding, and oven curing processes for semiconductor assembly.

According to an embodiment, there is provided an adhesive film composition that includes an elastomer resin having one or more of a hydroxy group, a carboxyl group, or an epoxy group, a film-forming resin, a silylated phenolic curing resin, an epoxy resin, a curing accelerator, and a filler.

In an implementation, the adhesive film composition may include about 5% to about 60% by weight of the elastomer resin, about 5% to about 60% by weight of the film-forming resin, about 5% to about 40% by weight of the epoxy resin, about 3% to about 25% by weight of the pre-reacted phenolic curing resin, about 0.01% to about 10% by weight of the curing accelerator, and about 3% to about 60% by weight of the filler, based on the total weight of solid content the composition.

The adhesive film composition may further include a phenolic curing resin in such an amount that the sum of the additional phenolic curing resin and the pre-reacted phenolic curing resin is about 3% to about 30% by weight, based on the total weight of the composition.

Explanation of the individual components constituting the adhesive film composition will be given below.

Elastomer Resin

The elastomer resin is a rubber component that imparts sufficient strength to a film in order to render the film easy to handle, and provides for the formation of a film with proper adhesive strength. The elastomer resin preferably contains hydroxyl, carboxyl, or epoxy groups. The weight average molecular weight of the elastomer resin is preferably about 50,000 to about 5,000,000, and more preferably about 100,000 to about 800,000.

Examples of elastomer resins suitable for use in the adhesive film composition include, e.g., acrylonitrile-, butadiene-, styrene-, acrylic-, isoprene-, ethylene-, propylene-, polyurethane- and silicone-based elastomers. These elastomer resins may be used alone, or in combination of two or more thereof.

The elastomer resin may be used in an amount of about 5% to about 60% by weight, based on the total weight of the adhesive film composition.

Film-Forming Resin

The film-forming resin imparts sufficient strength to a film in order to render the film easy to handle, and assists in forming a film with proper adhesive strength.

The film-forming resin may have a high glass transition temperature ($T_g$) of about −30° C. to about 200° C., preferably from about 0° C. to about 200° C.

The film-forming resin may be a phenolic or phenoxy resin that contains hydroxyl, epoxy, phenoxy, or alkyl groups, and preferably has a weight average molecular weight of about 200 to about 500,000.

For the film-forming resin having the high glass transition temperature ($T_g$) described above, there may be used, e.g., a phenolic or phenoxy resin that contains a hydroquinone, 2-bromohydroquinone, resorcinol, catechol, bisphenol A, bisphenol F, bisphenol AD, bisphenol S, 4,4'-dihydroxybiphenyl, bis(4-hydroxyphenyl)ether, phenol, cresol, cresol novolac, or fluorene moiety as a skeleton. The phenolic or phenoxy resin may have at least one alkyl, aryl, methylol, allyl, alicyclic, halogen, and/or nitro group. Also, one or more groups such as straight-chained alkyl, branched alkyl, allyl, substituted allyl, alicyclic, and alkoxycarbonyl groups may be introduced into the central carbon atom of the bisphenol skeleton.

The film-forming resin is preferably present in an amount of about 5% to about 60% by weight, based on the total weight of the adhesive film composition.

Phenolic Curing Resin Pre-Reacted with Silane Coupling Agent

The pre-reacted phenolic curing resin may be a silylated phenolic curing resin prepared by reacting a silane coupling agent with a phenolic curing resin. In an implementation, the silane coupling agent:phenolic curing resin molar ratio in the reaction may be about 1:5 to about 1:100.

The pre-reacted phenolic curing resin may be a reaction product obtained by reacting the silane coupling agent with the phenolic curing resin. In an implementation, some phenolic hydroxyl groups in the phenolic curing resin may not be converted to phenolic silyl ethers through reaction with the silane coupling agent, i.e., some phenolic hydroxyl groups may remain.

Phenolic Curing Resin Pre-Reacted with Silane Coupling Agent: Silane Coupling Agent Component The silane coupling agent used for the preparation of the pre-reacted phenolic curing resin may function as an adhesion enhancer for enhancing the adhesion of the resins to the surface of inorganic materials (e.g., silica) in the composition. Epoxy-containing silanes and mercapto-containing silanes are example types of the silane coupling agent.

Example silane coupling agents include epoxy-containing silanes, such as 2-(3,4-epoxycyclohexyl)-ethyltrimethoxysilane, 3-glycidoxytrimethoxysilane, 3-glycidoxypropyltrimethoxysilane, and 3-glycidoxypropyltriethoxysilane.

Example silane coupling agents also include amine-containing silanes, such as N-2-(aminoethyl)-3-aminopropylmethyldimethoxysilane, N-2-aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-1,3-dimethylbutylidene)propylamine, and N-phenyl-3-aminopropyltrimethoxysilane.

Example silane coupling agents also include mercapto-containing silanes, such as 3-mercaptopropylmethyldimethoxysilane and 3-mercaptopropyltriethoxysilane.

Example silane coupling agents also include isocyanate-containing silanes, such as 3-isocyanatopropyltriethoxysilane.

Phenolic Curing Resin Pre-Reacted with Silane Coupling Agent: Phenolic Curing Resin Component The phenolic curing resin is preferably a compound having two or more phenolic hydroxyl groups in one molecule. Preferable phenolic curing resins are bisphenol curing resins, such as bisphenol A, bisphenol F and bisphenol S resins, and phenolic resins, such as phenol novolac resins, bisphenol A novolac resins, cresol novolac resins, xylok resins, and biphenyl resins, all of which exhibit excellent electrolytic corrosion resistance when exposed to moisture.

Examples of commercially available phenolic curing resins include: simple phenolic curing resins, such as H-1, H-4, HF-1M, HF-3M, HF-4M, and HF-45 (Meiwa Plastic Industries Ltd. (Japan)); para-xylene type curing resins, such as MEH-78004S, MEH-7800SS, MEH-7800S, MEH-7800M, MEH-7800H, MEH-7800HH, and MEH-78003H (Meiwa Plastic Industries Ltd. (Japan)) KPH-F3065 (Kolon Chemical Co., Ltd. (Korea)); biphenyl type curing resins, such as MEH-7851SS, MEH-7851S, MEH7851M, MEH-7851H, MEH-78513H, and MEH-78514H (Meiwa Plastic Industries Ltd. (Japan)), and KPH-F4500 (Kolon Chemical Co., Ltd. (Korea)); and triphenylmethyl type curing resins, such as MEH-7500, MEH-75003S, MEH-7500SS, MEH-7500S, and MEH-7500H (Meiwa Plastic Industries Ltd. (Japan)). These phenolic curing agents may be used alone, or as a mixture of two or more thereof.

The phenolic curing resin is preferably represented by Formula 1.

Formula 1:

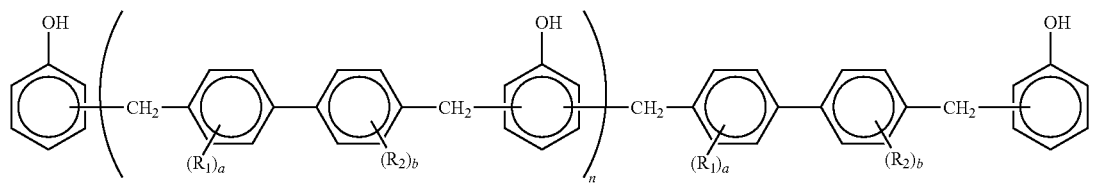

In Formula 1, $R_1$ and $R_2$ are each independently a $C_1$-$C_4$ alkyl group or a hydrogen atom, a and b are each independently from 0 to 4, and n is an integer from 0 to 7.

The phenolic curing resin of Formula 1 has two or more hydroxyl groups in its molecular structure, and exhibits excellent electrolytic corrosion resistance when exposed to moisture, good heat resistance, and superior reflow resistance because of its low moisture adsorption.

The phenolic curing resin of Formula 1 preferably has a hydroxyl equivalent weight of about 100 to about 600 g/eq., and more preferably about 170 to about 300 g/eq. If the hydroxyl equivalent weight of the phenolic curing resin is lower than about 100 g/eq., moisture absorption may tend to increase and the reflow resistance tends to degrade. Meanwhile, if the hydroxyl equivalent weight of the phenolic curing resin is higher than about 600 g/eq., the glass transition temperature may tend to decrease and the heat resistance may tend to deteriorate.

As described above, the pre-reacted phenolic curing resin may be prepared by reacting the silane coupling agent with the phenolic curing resin to remove volatile components such as alcohols and moisture. The molar ratio of the silane coupling agent (a) to the phenolic curing resin (b) used for the preparation of the pre-reacted phenolic curing resin is preferably from about 1:5 (a:b) to about 1:100 (a:b). If the proportion of the silane coupling agent is above about 1:5, gelling of the coupling agent tends to occur. Meanwhile, if the proportion of the silane coupling agent is less than about 1:100, the coupling agent may not sufficiently react with the phenolic curing resin.

The use of the pre-reacted phenolic curing resin may minimize the formation of voids and bubbles. The pre-reacted phenolic curing resin preferably has a weight average molecular weight of about 500 to about 6,000.

The pre-reacted phenolic curing resin is preferably present in an amount of about 3% to about 25% by weight, preferably about 4% to about 25% by weight, and very preferably about 4% to about 15% by weight based on the total weight of the adhesive film composition. The use of the pre-reacted phenolic curing resin in an amount of less than about 3% by weight may not provide sufficient adhesive strength for the final film. The use of the pre-reacted phenolic curing resin in an amount exceeding about 25% by weight may tend to deteriorate the adhesive strength of a final film.

Epoxy Resin

The epoxy resin is used as a curable adhesive. The epoxy resin preferably has an epoxy equivalent weight of about 100 to about 1,500 g/eq., more preferably about 150 to about 800 g/eq., and most preferably about 150 to about 400 g/eq. The use of epoxy resin having an epoxy equivalent weight lower than about 100 g/eq. may tend to deteriorate the adhesiveness of a cured product. Epoxy resin having an epoxy equivalent weight higher than about 1,500 g/eq. may tend to exhibit low glass transition temperature and poor heat resistance. There is no particular restriction on the state of the epoxy resin so long as the epoxy resin is curable and adhesive. However, taking into consideration the shape of a final film, the epoxy resin is preferably in a solid or substantially solid state. Preferably, the epoxy resin has at least one functional group.

Examples of the epoxy resin include bisphenol type epoxy resins, phenol novolac type epoxy resins, ortho-cresol novolac type epoxy resins, multifunctional epoxy resins, amine type epoxy resins, heterocyclic epoxy resins, substituted epoxy resins, and naphthol type epoxy resins.

Examples of commercially available bisphenol type epoxy resins include Epiclon 830-S, Epiclon EXA-830CRP, Epiclon EXA 850-S, Epiclon EXA-850CRP, and Epiclon EXA-835LV (Dainippon Ink and Chemicals Inc. (Japan)); Epicoat 807, Epicoat 815, Epicoat 825, Epicoat 827, Epicoat 828, Epicoat 834, Epicoat 1001, Epicoat 1004, Epicoat 1007, and Epicoat 1009 (Yuka-Shell Epoxy Co., Ltd. (Japan)); DER-330, DER-301, and DER-361 (Dow Chemical); and Yd-128 and YDF-170 (Kukdo Chemical Co., Ltd. (Korea)).

Examples of commercially available ortho-cresol novolac type epoxy resins include: YDCN-500-1P, YDCN-500-4P, YDCN-500-5P, YDCN-500-7P, YDCN-500-80P, and YDCN-500-90P (Kukdo Chemical Co., Ltd. (Korea)); and EOCN-102S, EOCN-103S, EOCN-104S, EOCN-1012, EOCN-1025, and EOCN-1027 (Nippon Kayaku Co., Ltd. (Japan)).

Examples of commercially available multifunctional epoxy resins include Epon 1031 S (Yuka-Shell Epoxy Co., Ltd. (Japan)); Araldite 0163 (CIBA Specialty Chemicals); and Denacol EX-611, Denacol EX-614, Denacol EX-614B, Denacol EX-622, Denacol EX-512, Denacol EX-521, Denacol EX-421, Denacol EX-411, and Denacol EX-321 (Nagase ChemteX Corp. (Japan)).

Examples of commercially available amine type epoxy resins include Epicoat 604 (Yuka-Shell Epoxy Co., Ltd. (Japan)); YH-434 (Tohto Kasei Co., Ltd. (Japan)); TETRAD-X and TETRAD-C (Mitsubishi Gas Chemical Company Inc. (Japan)); and ELM-120 (Sumitomo Chemical Co., Ltd. (Japan)). The heterocyclic epoxy resin is commercially available under the trademark PT-810 from CIBA Specialty Chemicals. Examples of commercially available substituted epoxy resins include ERL-4234, ERL-4299, ERL-4221, and ERL-4206 (UCC). Examples of commercially available naphthol type epoxy resins include Epiclon HP-4032, Epiclon HP-4032D, Epiclon HP-4700, and Epiclon 4701 (Dainippon Ink and Chemicals, Inc. (Japan)).

The epoxy resins may be used alone, or as a mixture of two or more thereof.

In an implementation, the epoxy resin may be present in an amount of about 5 to about 40% by weight, based on the total weight of the adhesive film composition.

The epoxy resin may be blended with the pre-reacted phenolic curing resin, or with the pre-reacted phenolic curing resin and the additional phenolic curing resin, such that the ratio of epoxy equivalent weight:hydroxyl equivalent weight is about 0.6:1 to about 1.4:1. That is, when the pre-reacted phenolic curing resin is used alone or simultaneously with the additional phenolic curing resin, the ratio of epoxy equivalent weight:hydroxyl equivalent weight is preferably adjusted to about 0.6:1 to about 1.4:1 and, more preferably, about 0.8:1 to about 1.2:1. If the ratio is below about 0.6:1 or above about 1.4:1, the adhesiveness and/or curability of the final adhesive film may tend to deteriorate.

Curing Accelerator

The curing accelerator is a catalyst that shortens the curing time, so as to completely cure the epoxy resin in the course of semiconductor processing. The curing accelerator may be, e.g., a phosphine, a boron, or an imidazole type.

Phosphine type curing accelerators suitable for use in the adhesive film composition include triphenylphosphine, tri-o-tolylphosphine, tri-m-tolylphosphine, tri-p-tolylphosphine, tri-2,4-xylylphosphine, tri-2,5-xylylphosphine, tri-3,5-xylylphosphine, tribenzylphosphine, tris(p-methoxyphenyl)phosphine, tris(p-tert-butoxyphenyl)phosphine, diphenylcyclohexylphosphine, tricyclohexylphosphine, tributylphosphine, tri-tert-butylphosphine, tri-n-octylphosphine, diphenylphosphinostyrene, diphenylphosphinous chloride, tri-n-octylphosphine oxide, diphenylphosphinyl hydroquinone, tetrabutylphosphonium hydroxide, tetrabutylphosphonium acetate, benzyltriphenylphosphonium hexafluoroantimonate, tetraphenylphosphonium tetraphenylborate, tetraphenylphosphonium tetra-p-tolylborate, benzyltriphenylphosphonium tetraphenylborate, tetraphenylphosphonium tetrafluoroborate, p-tolyltriphenylphosphonium tetra-p-tolylborate, triphenylphosphine triphenylborane, 1,2-bis(diphenylphosphino)ethane, 1,3-bis(diphenylphosphino)propane, 1,4-bis(diphenylphosphino)butane, and 1,5-bis(diphenylphosphino)pentane.

Boron type curing accelerators suitable for use in the adhesive film composition are phenylboronic acid, 4-methylphenylboronic acid, 4-methoxyphenylboronic acid, 4-trifluoromethoxyphenylboronic acid, 4-tert-butoxyphenylboronic acid, 3-fluoro-4-methoxyphenylboronic acid, pyridine-triphenylborane, 2-ethyl-4-methylimidazolium tetraphenylborate, 1,8-diazabicyclo[5.4.0]undecene-7-tetraphenylborate, 1,5-diazabicyclo[4.3.0]nonene-5-tetraphenylborate, and lithium triphenyl(n-butyl)borate.

Imidazole type curing accelerators suitable for use in the adhesive film composition are 2-methylimidazole, 2-undecylimidazole, 2-heptadecylimidazole, 2-ethyl-4-methylimidazole, 2-phenylimidazole, 2-phenyl-4-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazoly-(1')]-ethyl-s-triazine, 2,4-diamino-6-[2'-undecylimidazoly-(1')]-ethyl-s-triazine, 2,4-diamino-6-[2'-ethyl-4'-methylimidazoly-(1')]-ethyl-s-triazine, 2,4-diamino-6-[2'-methylimidazoly-(1')]-ethyl-s-triazine isocyanuric acid adduct dihydrate, 2-phenylimidazole isocyanuric acid adduct, 2-methylimidazole isocyanuric acid adduct dihydrate, 2-phenyl-4,5-dihydroxymethylimidazole, 2-phenyl-4-methyl-5-hydroxymethylimidazole, 2,3-dihydro-1H-pyrrolo[1,2-a]benzimidazole, 4,4'-methylene-bis(2-ethyl-5-methylimidazole), 2-methylimidazoline, 2-phenylimidazoline, 2,4-diamino-6-vinyl-1,3,5-triazine, 2,4-diamino-6-vinyl-1,3,5-triazine isocyanuric acid adduct, 2,4-diamino-6-methacryloyloxyethyl-1,3,5-triazine isocyanuric acid adduct, 1-(2-cyanoethyl)-2-ethyl-4-methylimidazole, 1-cyanoethyl-2-methylimidazole, 1-(2-cyanoethyl)-2-phenyl-4,5-di-(cyanoethoxymethyl)imidazole, 1-acetyl-2-phenylhydrazine, 2-ethyl-4-methylimidazoline, 2-benzyl-4-methyl imidazoline, 2-ethylimidazoline, 2-phenylimidazole, 2-phenyl-4,5-dihydroxymethylimidazole, melamine, and dicyandiamide.

The curing accelerators may be used alone, or in combination of two or more thereof.

In an embodiment, the curing accelerator may be represented by Formula 2 or Formula 3 below.

Formula 2:

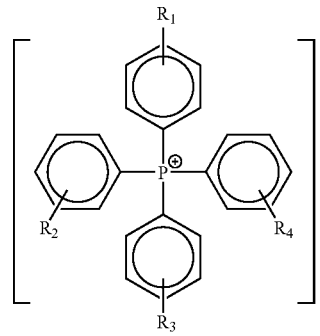

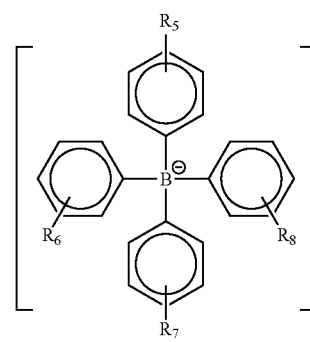

In Formula 2, $R_1$ through $R_8$ are each independently a hydrogen atom, a halogen atom, or an alkyl group.

Formula 3:

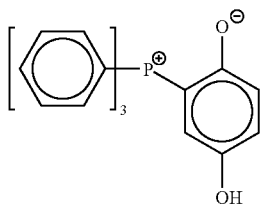

The use of the curing accelerator of Formula 2 or 3 may increase the curing initiation temperature when compared to the use of an amine type curing agent or an imidazole type curing accelerator, making it easy to obtain a uniform curing rate. In addition, the curing accelerator of Formula 2 or 3 is less reactive at room temperature than an amine type curing agent or an imidazole type curing accelerator. Therefore, the curing accelerator of Formula 2 or 3 is advantageous in ensuring good storage stability.

When the phenolic resin of Formula 1 is used in the presence of the curing accelerator of Formula 2 or 3, the curing of the phenolic resin may be inhibited, thereby reducing the occurrence of defects resulting from non-uniform curing. Further, the adhesive film composition using the curing accelerator may have a lower electrical conductivity than that using an amine curing agent or an imidazole curing accelerator, which may provide better results in pressure cooker test ("PCT") reliability.

The content of the curing accelerator is preferably about 0.01% to about 10% by weight and, more preferably, about 0.03% to about 5% by weight, based on the total weight of the adhesive film composition. The presence of the curing accelerator in an amount of less than about 0.01% by weight may result in insufficient crosslinking of the epoxy resin and may tend to deteriorate the heat resistance of a final film. The presence of the curing accelerator in an amount of more than about 10% by weight may tend to deteriorate the storage stability of the final film.

Filler

The filler is a component that imparts thixotropic properties to the composition to control the melt viscosity of the composition. An inorganic or organic filler may be used. As the inorganic filler, there can be used a metal component, such as gold, silver, copper, or nickel powder, or, e.g., alumina, aluminum hydroxide, magnesium hydroxide, calcium carbonate, magnesium carbonate, calcium silicate, magnesium silicate, calcium oxide, magnesium oxide, aluminum nitride, silica, boron nitride, titanium dioxide, glass, iron oxide, ceramic, etc. The organic filler may be carbon-based, rubber-based, polymer-based, etc. Spherical silica or amorphous silica may be used as the inorganic filler. The average particle diameter of the filler is preferably about 5 nm to about 10 μm and, more preferably, about 10 nm to about 3 μm.

The filler is preferably used in an amount of about 3% to about 60% by weight and, more preferably, about 5% to about 30% by weight, based on the total solids weight of the adhesive film composition. If the filler is used in an amount less than about 3% by weight, the reinforcing effect by the addition of the filler may be negligible. Meanwhile, if the filler is used in an amount larger than about 60% by weight, the adhesion to an adherend may tend to deteriorate.

Additional Phenolic Curing Resin

The adhesive film composition may further comprise an additional phenolic curing resin. The additional phenolic curing resin is different from the phenolic curing resin used for the preparation of the pre-reacted phenolic curing resin in that it is not previously reacted with the silane coupling agent. The kind of the additional phenolic curing resin may be the same as that of the phenolic curing resin used in preparing the pre-reacted phenolic curing resin. The epoxy resin may be blended with the pre-reacted phenolic curing resin and the additional phenolic curing resin such that a ratio of epoxy equivalent weight:hydroxyl equivalent weight is about 0.6:1 to about 1.4:1

The additional phenolic curing resin is preferably used in such an amount that the sum of the additional phenolic curing resin and the pre-reacted phenolic curing resin is about 3% to about 30% by weight, based on the total weight of the composition. If the sum is less than about 3% by weight, flowability and heat resistance may be impaired. Meanwhile, if the sum is more than about 30% by weight, moisture resistance and reflow resistance may be impaired.

Additional Silane Coupling Agent

The adhesive film composition may further comprise an additional silane coupling agent. The kind of the additional silane coupling agent may be the same as that of the silane coupling agent used for the preparation of the pre-reacted phenolic curing resin.

The additional silane coupling agent is preferably used in an amount of about 0.01% to about 10% by weight, and more preferably about 0.30% to about 5% by weight, based on the total weight of the adhesive film composition.

Organic Solvent

The adhesive film composition may further include an organic solvent to provide low viscosity, facilitating the formation of a film. Taking into consideration the volatility of the organic solvent during film formation, the organic solvent may be, e.g., toluene, xylene, propylene glycol monomethyl ether acetate, benzene, acetone, methyl ethyl ketone ("MEK"), tetrahydrofuran, dimethylformamide ("DMF"), cyclohexanone, and mixtures thereof.

In an implementation, the amount of the organic solvent remaining after film formation may be about 1% or less. Volatile organic solvent remaining in an excessive amount may induce the formation of voids when dies are attached to a PCB in semiconductor assembly processes.

Prior to film formation, the organic solvent may be present in an amount of about 5% to about 85% by weight with respect to the total weight of the adhesive film composition.

The adhesive film composition can be used to produce an adhesive film for semiconductor assembly without the need to use a special apparatus or equipment. The adhesive film can be formed by a general method known in the art. For example, the elastomer resin, the film-forming resin, the epoxy resin, the curing resin, the curing accelerator, the silane coupling agent, the pre-reacted phenolic curing resin, the filler, etc., may be dissolved in organic solvent. Then, the solution may be sufficiently kneaded using a bead mill, applied to a release-treated polyethylene terephthalate ("PET") film, and heat-dried to form an adhesive film with an appropriate coating thickness.

The thickness of the adhesive film is preferably about 5 to about 200 μm and, more preferably, about 10 to about 100 μm. A thickness smaller than 5 μm may make it difficult to obtain sufficient adhesive strength. A thickness larger than about 200 μm may be economically undesirable.

As discussed above in connection with FIGS. 1A and 1B, another embodiment provides a dicing die bonding film comprising an adhesive film produced using the adhesive film composition according to an embodiment. The dicing die bonding film may be produced by sequentially laminating a PSA layer and an adhesive film layer on a base film, wherein the adhesive film layer is produced using the adhesive film composition according to an embodiment.

The PSA layer can be produced using a general PSA composition. Preferably, the PSA layer contains a PSA polymeric binder, a UV-curable acrylate, and a photoinitiator. The UV-curable acrylate may be present in an amount of about 20 to about 150 parts by weight with respect to 100 parts by weight of the polymeric binder, and the photoinitiator may be present in an amount of about 0.1 to about 5 parts by weight with respect to 100 parts by weight of the UV-curable acrylate.

It is preferred that the base film is radiation-transmissive. The base film may be formed of a highly light-transmissive material when a radiation curable pressure-sensitive adhesive responding to UV irradiation is applied to the base film. Examples of polymeric materials for the base film include polyolefin homopolymers and copolymers, such as polyethylene, polypropylene, propylene-ethylene copolymers, ethylene-ethyl acrylate copolymers, ethylene-methyl acrylate copolymers and ethylene-vinyl acetate copolymers, polycarbonate, polymethyl methacrylate, polyvinyl chloride, and polyurethane copolymers. The thickness of the base film may be determined taking into consideration various factors, such as tensile strength, elongation, and radiation transmission. It is desirable that the base film has a thickness of about 50 to about 200 μm.

The following Examples and Comparative Examples are provided in order to set forth particular details of one or more embodiments. However, it will be understood that the embodiments are not limited to the particular details described.

EXAMPLES

Preparative Example 1

8.0 mol of a novolac type phenolic resin (hydroxyl equivalent weight=106, HF-1M, Meiwa Plastic Industries Ltd. (Japan)) was completely dissolved in a four-neck round-bottom flask at 120-140° C. The solution was stabilized at 130° C., and then 0.2 mol of triphenylphosphine was added thereto. The mixture was sufficiently stirred for 30 minutes, and 1.0 mol of 3-glycidoxypropyltrimethoxysilane (molecular weight=236, KBM-403, Shin-Etsu Chemical Co., Ltd. (Japan)) was slowly added dropwise to the flask. The resulting mixture was allowed to react at 130-150° C. for 4 hours. After completion of the reaction, the reaction mixture was cooled to room temperature.

The silylated phenolic curing resin reaction product was ground using a mixer, waterproofed and stored. At this time, alcohols as by-products of the reaction between the silane coupling agent and the phenolic resin, moisture remaining in the resin, and other volatile components were separated from the reaction product using a vacuum pump and a condenser.

Examples 1-6 and Comparative Examples 1-3

The pre-reacted phenolic curing resin prepared as described above in Preparative Example 1 was used to prepare adhesive film compositions (Examples 1-6).

For each Example and Comparative Example, the components and weight parts thereof shown in Table 1 in FIG. 2 (Examples 1-6) and Table 2 in FIG. 3 (Comparative Examples 1-3) were put into a 1 L cylindrical flask equipped with a high-speed agitator and dispersed at 4,000 rpm for 20 minutes to prepare respective adhesive film compositions. Each of the compositions was finely ground using a bead mill for 30 minutes. The grinding was repeated at least two times. The powder was filtered through a 50 μm capsule filter, coated to a thickness of 20 μm on a release-treated PET film using an applicator, and dried at 90-120° C. for 20 minutes to obtain an adhesive film.

Evaluation of Physical Properties of the Adhesive Films

The adhesive films produced in Examples 1-6 and Comparative Examples 1-3 were evaluated for physical properties including volatile gas content, bubble test, reflow resistance test, and die shear strength as described below. After reflow resistance and temperature cycle resistance tests were conducted on the adhesive films, delamination and cracks of the adhesive films were observed by scanning acoustic tomography ("SAT").

(1) Volatile Gas Content 1 g of each of the films was dissolved in 50 g of 1,4-dioxane, left standing for 6 hours, and passed through a 0.45 μm capsule filter to obtain a sample. Ethyl carbitol as a calibration material was added to the sample in a ratio of 500:1.

The content of volatile gases in the mixture was measured by gas chromatography ("GC") (Agilent 5890) under the following conditions: column: DB-1 (length=30 m, ID=0.53 mm, film thickness=0.88 μm); first retention time: 3 min (40° C.); heating rate: 10° C./min from 40° C. to 280° C.; second retention time: 10 min (at 280° C.); flow rate: 10 ml/min. The results are shown in Tables 3 and 4.

(2) Bubble Test

Die attach and wire bonding processes were simulated on the adhesive films in accordance with the following procedure. First, a 530 μm-thick wafer coated with a silicon dioxide film was cut into chips (size=10 mm×10 mm) and laminated with each of the adhesive films at 60° C. The laminate was cut to leave the adhered portion thereof only. After slide glasses (size=20 mm×20 mm) were placed on hot plates at 120° C. and 150° C., the chips were momentarily exposed to the respective slide glasses for a short time to evaluate whether or not volatile components were evaporated to form bubbles. When voids were formed over 10% or more of the adhered area of the film due to the formation of bubbles, the film was judged to be 'poor'.

(3) Reflow Resistance Test

Each of the adhesive films was mounted on a 100 μm-thick wafer coated with a silicon dioxide film, and cut into chips having different sizes (8 mm×8 mm, 10 mm×10 mm). The chips were attached on multi-chip packages ("MCPs") to form a two-layer structure. The resulting structure was molded using an epoxy molding compound ("EMC") (SG-8500BC, Cheil Industries (Korea)) at 175° C. for 60 seconds, and post-cured at 175° C. for 2 hours to obtain a test piece. The test piece was allowed to absorb moisture at 85° C. and 85% RH for 168 hours, and reflowing was conducted three times at a maximum of 260° C. Thereafter, delamination and cracks of the test piece were observed by SAT. The results are shown in Tables 3 and 4 in FIGS. 4 and 5, respectively. The test piece was judged to be 'poor' when 15% or more of the test piece was delaminated and cracks were observed.

(4) Die Shear Strength

A 530 μm-thick wafer coated with a silicon dioxide film was cut into chips having a size of 5 mm×5 mm. The chips were laminated with the respective adhesive films at 60° C. Each of the laminates was cut to leave the adhered portion thereof only. The chip (5 mm×5 mm) was placed on a lower chip (10 mm×10 mm), pressed under a load of 1 kgf on a hot plate at 120° C. for one second to be attached on the lower chip, and cured at 175° C. for 2 hours. The obtained test piece was allowed to absorb moisture at 85° C. and 85% RH for 168 hours, and reflowing was conducted three times at a maximum of 260° C. Thereafter, the die shear strength of the upper chip was measured at a rate of 100 μm/sec at 250° C. The results are shown in Tables 3 and 4.

As can be seen from the results in Tables 3 and 4, the adhesive films of Examples 1-6, which were produced using the phenolic curing resin pre-reacted with the silane coupling agent, showed low volatile gas contents and superior reflow resistance when compared to the adhesive films of Comparative Examples 1-3, which were produced by direct addition of the silane coupling agent without being pre-reacted with the phenolic curing resin.

The bubble test results reveal that high volatile gas contents led to the formation of a number of bubbles in the adhesive films of Comparative Examples 1-3. Further, the reflow resistance test results reveal that serious delamination occurred and low die shear strength was obtained due to the formation of bubbles in the adhesive films of Comparative Examples 1-3. As a result, high reliability of the adhesive films of Comparative Examples 1-3 could not be attained.

As apparent from the above description, the adhesive film composition for semiconductor assembly according to exemplary embodiments may include a phenolic curing resin pre-reacted with a silane coupling agent, and may be used to produce an adhesive film for semiconductor assembly. The composition may include the elastomer resin containing hydroxyl, carboxyl or epoxy groups, the film-forming resin, the phenolic curing resin pre-reacted with a silane coupling agent, the epoxy resin, the curing accelerator, and the filler. The phenolic curing resin may be pre-reacted with the silane coupling agent to remove volatile components, such as alcohols, moisture, and volatile reaction by-products, prior to incorporation into the composition. The removal of volatile components may minimize the formation of voids and bubbles in the adhesive film. Therefore, the use of the silylated phenolic curing resin in the composition may impart high reliability to the adhesive film.

Example embodiments have been disclosed herein, and although specific terms are employed, they are used and are to be interpreted in a generic and descriptive sense only and not for purpose of limitation. For example, while some embodiments are described in connection with packaging a dies such as semiconductor device, it will be appreciated that other dies, e.g., optical or opto-electronic device dies, microelectromechanical systems (MEMS) dies, etc. Accordingly, it will be understood by those of ordinary skill in the art that various changes in form and details may be made without departing from the spirit and scope of the present invention as set forth in the following claims.

What is claimed is:

1. An adhesive film composition, comprising:
an elastomer resin having one or more of a hydroxy group, a carboxyl group, or an epoxy group;
a film-forming resin;
a silylated phenolic curing resin;
an epoxy resin;
a curing accelerator; and
a filler, wherein:
the silylated phenolic curing resin includes a phenolic curing resin moiety and a silane coupling agent moiety, and
the silane coupling agent moiety includes one or more of an epoxy group, an amine group, or a mercapto group.

2. The composition as claimed in claim 1, wherein:
the silylated phenolic curing resin includes a reaction product of a phenolic curing resin and a silane coupling agent, and
the silane coupling agent includes one or more of 2-(3,4-epoxycyclohexyl)-ethyltrimethoxysilane, 3-glycidoxytrimethoxysilane, 3-glycidoxypropyltrimethoxysilane, 3-glycidoxypropyltriethoxysilane, N-2-(aminoethyl)-3-aminopropylmethyldimethoxysilane, N-2-aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-1,3-dimethylbutylidene)propylamine, N-phenyl-3-aminopropyltrimethoxysilane, 3-mercaptopropylmethyldimethoxysilane, or 3-mercaptopropyltriethoxysilane.

3. The composition as claimed in claim 2, wherein:
the phenolic curing resin is represented by Formula 1, Formula 1:

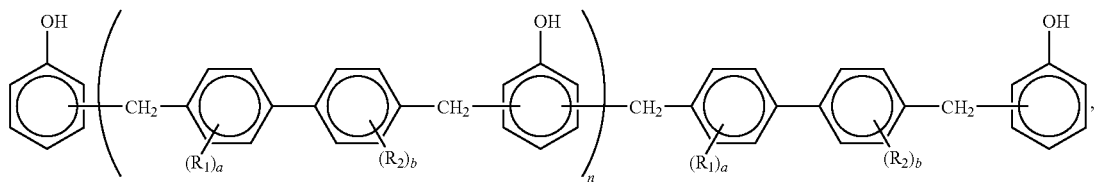

in Formula 1, $R_1$ and $R_2$ are each independently a $C_1$-$C_4$ alkyl group or a hydrogen atom, a and b are each independently from 0 to 4, and n is an integer from 0 to 7.

4. The composition as claimed in claim 1, wherein the composition includes:
about 5% to about 60% by weight of the elastomer resin,
about 5% to about 60% by weight of the film-forming resin,
about 3% to about 25% by weight of the silylated phenolic curing resin,
about 5% to about 40% by weight of the epoxy resin,
about 0.01% to about 10% by weight of the curing accelerator, and
about 3% to about 60% by weight of the filler, based on the total weight of solid content of the composition.

5. The composition as claimed in claim 4, further comprising a second phenolic curing resin, wherein a combined amount of the second phenolic curing resin and the silylated phenolic curing resin is about 3% to about 30% by weight, based on the total weight of the composition.

6. The composition as claimed in claim 1, wherein:
the curing accelerator is represented by Formula 2 or Formula 3:

Formula 2:

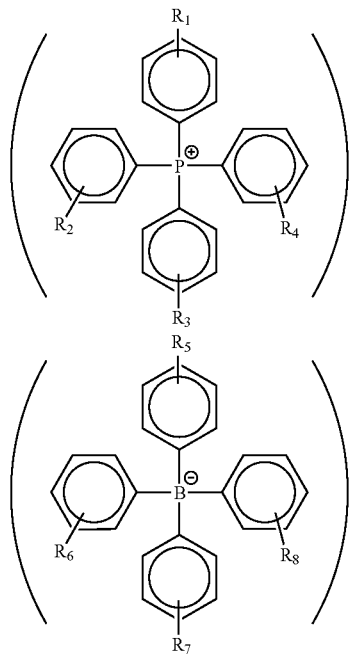

Formula 3:

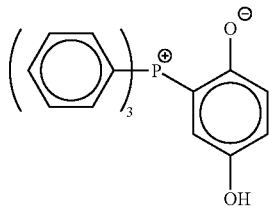

in Formula 2, $R_1$ through $R_8$ are each independently a hydrogen atom, a halogen atom, or an alkyl group.

7. The composition as claimed in claim 1, wherein the epoxy resin includes one or more of a bisphenol type epoxy resin, a phenol novolac type epoxy resin, an ortho-cresol novolac type epoxy resin, a multifunctional epoxy resin, an amine type epoxy resin, a heterocyclic epoxy resin, a substituted epoxy resin, or a naphthol type epoxy resin.

8. The composition as claimed in claim 1, wherein the epoxy resin and the silylated phenolic curing resin combined have a ratio of epoxy equivalent weight:hydroxyl equivalent weight that is about 0.6:1 to about 1.4:1.

9. The composition as claimed in claim 1, wherein the film-forming resin has a glass transition temperature of about −30° C. to about 200° C.

10. The composition as claimed in claim 1, wherein:
the filler is an inorganic filler,
the filler is spherical or amorphous in shape, and
the filler has an average particle diameter of about 5 nm to about 10 μm.

11. The composition as claimed in claim 1, further comprising a silane coupling agent.

12. A device package, comprising:
a die;
a next-level substrate; and
an adhesive member disposed between the die and the next-level substrate, wherein the adhesive member is formed using the adhesive film composition as claimed in claim 1.

13. The device package as claimed in claim 12, wherein:
the silylated phenolic curing resin includes a reaction product of a phenolic curing resin and a silane coupling agent, and
the silane coupling agent includes one or more of 2-(3,4-epoxycyclohexyl)-ethyltrimethoxysilane, 3-glycidoxytrimethoxysilane, 3-glycidoxypropyltrimethoxysilane, 3-glycidoxypropyltriethoxysilane, N-2-(aminoethyl)-3-aminopropylmethyldimethoxysilane, N-2-aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-1,3-dimethylbutylidene)propylamine, N-phenyl-3-aminopropyltrimethoxysilane, 3-mercaptopropylmethyldimethoxysilane, or 3-mercaptopropyltriethoxysilane.

14. An adhesive film for semiconductor assembly, the film comprising:
an elastomer resin having one or more of a hydroxy group, a carboxyl group, or an epoxy group;
a film-forming resin;
a silylated phenolic curing resin;
an epoxy resin;
a curing accelerator; and
a filler, wherein:
the silylated phenolic curing resin includes a phenolic curing resin moiety and a silane coupling agent moiety, and
the silane coupling agent moiety includes one or more of an epoxy group, an amine group, or a mercapto group.

15. The film as claimed in claim 14, wherein:
the silylated phenolic curing resin includes a reaction product of a phenolic curing resin and a silane coupling agent, and
the silane coupling agent includes one or more of 2-(3,4-epoxycyclohexyl)-ethyltrimethoxysilane, 3-glycidoxytrimethoxysilane, 3-glycidoxypropyltrimethoxysilane, 3-glycidoxypropyltriethoxysilane, N-2-(aminoethyl)-3-aminopropylmethyldimethoxysilane, N-2-aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-1,3-dimethylbutylidene)propylamine, N-phenyl-3-aminopropyltrimethoxysilane, 3-mercaptopropylmethyldimethoxysilane, or 3-mercaptopropyltriethoxysilane.

16. A method of making an adhesive film, the method comprising:
preparing a composition including an elastomer resin, a film-forming resin, a silylated phenolic curing resin, an epoxy resin, a curing accelerator, and a filler; and
forming a film using the composition, wherein:
the elastomer resin has one or more of a hydroxy group, a carboxyl group, or an epoxy group,
the silylated phenolic curing resin includes a phenolic curing resin moiety and a silane coupling agent moiety, and
the silane coupling agent moiety includes one or more of an epoxy group, an amine group, or a mercapto group.

17. The method as claimed in claim 16, wherein the silylated phenolic curing resin is a phenolic curing resin treated with a silane coupling agent, including one or more of an epoxy group, an amine group, or a mercapto group, in a silane coupling agent:phenolic curing resin molar ratio of about 1:5 to about 1:100.

18. The method as claimed in claim 16, wherein:
the silylated phenolic curing resin includes a reaction product of a phenolic curing resin and a silane coupling agent, and the silane coupling agent includes one or more of 2-(3,4-epoxycyclohexyl)-ethyltrimethoxysilane, 3-glycidoxytrimethoxysilane, 3-glycidoxypropyltrimethoxysilane, 3-glycidoxypropyltriethoxysilane, N-2-(aminoethyl)-3-aminopropylmethyldimethoxysilane, N-2-aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-1,3-dimethylbutylidene)propylamine, N-phenyl-3-aminopropyltrimethoxysilane, 3-mercaptopropylmethyldimethoxysilane, or 3-mercaptopropyltriethoxysilane.

19. A dicing die bonding film, comprising:
a base layer, a UV-curable adhesive layer, and an adhesive film, wherein the adhesive film includes:
an elastomer resin having one or more of a hydroxy group, a carboxyl group, or an epoxy group;
a film-forming resin;
a silylated phenolic curing resin;
an epoxy resin;
a curing accelerator; and
a filler, wherein:
the silylated phenolic curing resin includes a phenolic curing resin moiety and a silane coupling agent moiety, and
the silane coupling agent moiety includes one or more of an epoxy group, an amine group, or a mercapto group.

20. The dicing die bonding film as claimed in claim 19, wherein:
the UV-curable adhesive layer includes a polymeric binder, a UV-curable acrylate, and a photoinitiator,
the UV-curable acrylate is present in an amount of about 20 to about 150 parts by weight with respect to 100 parts by weight of the polymeric binder, and
the photoinitiator is present in an amount of about 0.1 to about 5 parts by weight with respect to 100 parts by weight of the UV-curable acrylate.

21. The dicing die bonding film as claimed in claim 19, wherein:
the silylated phenolic curing resin includes a reaction product of a phenolic curing resin and a silane coupling agent, and
the silane coupling agent includes one or more of 2-(3,4-epoxycyclohexyl)-ethyltrimethoxysilane, 3-glycidoxytrimethoxysilane, 3-glycidoxypropyltrimethoxysilane, 3-glycidoxypropyltriethoxysilane, N-2-(aminoethyl)-3-aminopropylmethyldimethoxysilane, N-2-aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-1,3-dimethylbutylidene)propylamine, N-phenyl-3-aminopropyltrimethoxysilane, 3-mercaptopropylmethyldimethoxysilane, or 3-mercaptopropyltriethoxysilane.

22. A method of manufacturing a device package, the method comprising:
adhering a die to a next-level substrate using an adhesive member; and
encapsulating the die on the next-level substrate, wherein:
the adhesive member includes:
an elastomer resin having one or more of a hydroxy group, a carboxyl group, or an epoxy group;
a film-forming resin;
a silylated phenolic curing resin;
an epoxy resin;
a curing accelerator; and
a filler,
the silylated phenolic curing resin includes a phenolic curing resin moiety and a silane coupling agent moiety, and
the silane coupling agent moiety includes one or more of an epoxy group, an amine group, or a mercapto group.

23. The method as claimed in claim 22, wherein:
the silylated phenolic curing resin includes a reaction product of a phenolic curing resin and a silane coupling agent, and
the silane coupling agent includes one or more of 2-(3,4-epoxycyclohexyl)-ethyltrimethoxysilane, 3-glycidoxytrimethoxysilane, 3-glycidoxypropyltrimethoxysilane, 3-glycidoxypropyltriethoxysilane, N-2-(aminoethyl)-3-aminopropylmethyldimethoxysilane, N-2-aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-1,3-dimethylbutylidene)propylamine, N-phenyl-3-aminopropyltrimethoxysilane, 3-mercaptopropylmethyldimethoxysilane, or 3-mercaptopropyltriethoxysilane.

* * * * *